United States Patent
Zhang et al.

(10) Patent No.: US 11,430,660 B2
(45) Date of Patent: Aug. 30, 2022

(54) CONFINED WORK FUNCTION MATERIAL FOR GATE-ALL AROUND TRANSISTOR DEVICES

(71) Applicant: INTERNATIONAL BUSINESS MACHINES CORPORATION, Armonk, NY (US)

(72) Inventors: Jingyun Zhang, Albany, NY (US); Choonghyun Lee, Rensselaer, NY (US); Takashi Ando, Tuckahoe, NY (US); Alexander Reznicek, Troy, NY (US); Pouya Hashemi, Purchase, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1 day.

(21) Appl. No.: 17/136,826

(22) Filed: Dec. 29, 2020

(65) Prior Publication Data
US 2021/0118683 A1   Apr. 22, 2021

Related U.S. Application Data

(62) Division of application No. 16/287,322, filed on Feb. 27, 2019, now Pat. No. 10,943,787.

(51) Int. Cl.
*H01L 21/28*   (2006.01)
*H01L 29/66*   (2006.01)
(Continued)

(52) U.S. Cl.
CPC .. *H01L 21/28247* (2013.01); *H01L 21/28088* (2013.01); *H01L 21/28568* (2013.01);
(Continued)

(58) Field of Classification Search
CPC ............ H01L 29/6653; H01L 29/6681; H01L 29/42392
See application file for complete search history.

(56) References Cited

U.S. PATENT DOCUMENTS 8,063,434 B1  11/2011  Polishchuk et al.
8,492,852 B2   7/2013  Chen et al.
(Continued)

OTHER PUBLICATIONS

Anonymous, "Method and Structure to achieve Multi Threshold Voltage with Simplified Process Flow for Field Effect Transistor by Forming Air Spacer", ip.com Prior Art Database Technical Disclosure. IP.com No. IPCOM000255464D. Sep. 27, 2018. pp. 1-7.

(Continued)

*Primary Examiner* — Julia Slutsker
(74) *Attorney, Agent, or Firm* — Tutunjian & Bitetto, P.C.; L. Jeffrey Kelly

(57) ABSTRACT

A method of forming a nanosheet field effect transistor device is provided. The method includes forming a stack of alternating sacrificial layer segments and nanosheet layer segments on a substrate. The method further includes removing the sacrificial layer segments to form channels on opposite sides of the nanosheet layer segments. The method further includes depositing a gate dielectric layer around each of the nanosheet layer segments, and forming a work function material block on the gate dielectric layer to form a gate-all-around structure on the nanosheet layer segments. The method further includes forming a capping layer on the work function material block.

20 Claims, 5 Drawing Sheets

(51) Int. Cl.
  *H01L 21/285* (2006.01)
  *H01L 29/78* (2006.01)
  *H01L 29/423* (2006.01)
  *H01L 29/49* (2006.01)
  *H01L 29/06* (2006.01)

(52) U.S. Cl.
  CPC .... *H01L 29/42392* (2013.01); *H01L 29/4966* (2013.01); *H01L 29/6653* (2013.01); *H01L 29/6681* (2013.01); *H01L 29/66553* (2013.01); *H01L 29/7853* (2013.01); *H01L 29/0673* (2013.01)

(56) References Cited

U.S. PATENT DOCUMENTS

| | | | |
|---|---|---|---|
| 9,502,572 | B2 | 11/2016 | Yamazaki |
| 10,026,838 | B2 | 7/2018 | Wu et al. |
| 2018/0083116 | A1 | 3/2018 | Ando et al. |
| 2020/0105755 | A1* | 4/2020 | Cea ..................... H01L 29/7842 |
| 2020/0119203 | A1* | 4/2020 | Teo ................... H01L 29/42392 |
| 2020/0287024 | A1* | 9/2020 | Dewey .............. H01L 29/66795 |

OTHER PUBLICATIONS

Knizhnik et al., "Segregation trends of the metal alloys Mo—Re and Mo—Pt on Hf O2: A first-principles study", Journal of Applied Physics. vol. 100, Issue 1. Jul. 7, 2006. pp. 1-7.

List of IBM Patents or Patent Applications Treated as Related dated Dec. 29, 2020, 2 pages.

\* cited by examiner

CONFINED WORK FUNCTION MATERIAL FOR GATE-ALL AROUND TRANSISTOR DEVICES

BACKGROUND

The present invention generally relates to gate-all-around (GAA) structures, and more particularly to gate-all-around structures for super low threshold voltage (Vt) transistor devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a nanosheet field effect transistor device is provided. The method includes forming a stack of alternating sacrificial layer segments and nanosheet layer segments on a substrate. The method further includes removing the sacrificial layer segments to form channels on opposite sides of the nanosheet layer segments. The method further includes depositing a gate dielectric layer around each of the nanosheet layer segments, and forming a work function material block on the gate dielectric layer to form a gate-all-around structure on the nanosheet layer segments. The method further includes forming a capping layer on the work function material block.

In accordance with another embodiment of the present invention, a method of forming a nanosheet field effect transistor device is provided. The method includes forming a first sacrificial layer on a substrate. The method further includes forming a first nanosheet layer on the first sacrificial layer, and forming a second sacrificial layer on the first nanosheet layer. The method further includes forming a device template on the second sacrificial layer. The method further includes forming a trench through the first sacrificial layer, first nanosheet layer, and second sacrificial layer to form a first sacrificial layer segment on the substrate, a first nanosheet layer segment on the first sacrificial layer segment, and a second sacrificial layer segment on the first nanosheet layer segment, wherein the trench extends into the substrate. The method further includes removing the first and second sacrificial layer segments to form channels on opposite sides of the first nanosheet layer segment, and forming a gate dielectric layer around the first nanosheet layer segment. The method further includes forming a work function material layer on the gate dielectric layer, and removing a portion of the work function material layer to form a work function material block. The method further includes forming a capping layer on the work function material block.

In accordance with yet another embodiment of the present invention, a nanosheet field effect transistor device is provided. The nanosheet field effect transistor device includes a first source/drain and a second source/drain on a substrate, and at least one nanosheet layer segment disposed between the first source/drain and a second source/drain. The nanosheet field effect transistor device further includes a gate dielectric layer on each of the at least one nanosheet layer segment(s). The nanosheet field effect transistor device further includes an oxygen rich transition metal nitride work function block on the gate dielectric layer and the at least one nanosheet layer segment(s), and a capping layer on the work function material block.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a field effect transistor device with a super low threshold voltage for high performance devices. A super low threshold voltage can be achieved using an oxygen-rich transition metal nitride work function material in the gate structure.

Embodiments of the present invention provide a method of fabricating a field effect transistor device with a super low threshold voltage for high performance devices by forming an oxygen-rich transition metal nitride work function material on a gate dielectric layer to form a super low threshold voltage transistor device.

Embodiments of the present invention provide a gate structure including an oxygen-rich transition metal nitride work function material with a capping layer to prevent oxygen diffusion out of the oxygen-rich transition metal nitride during subsequent processing steps, for example, back-end-of-line (BEOL) processing. The super low threshold voltage FET can avoid degradation of the gate stack quality by avoiding oxygen diffusion out of the oxygen-rich transition metal nitride. Degradation of the gate stack quality can cause the device threshold voltage shift to higher PFET threshold voltages (Vt). A high work function for, for example, a TiON electrode may not be stable during back end of line processing due to redistribution of oxygen within a high-k/metal gate structure without an oxygen barrier/cap.

Exemplary applications/uses to which the present invention can be applied include, but are not limited to: high performance logic devices (e.g., NAND gates, NOR gates, XOR gates, etc.)

It is to be understood that aspects of the present invention will be described in terms of a given illustrative architecture; however, other architectures, structures, substrate materials and process features and steps can be varied within the scope of aspects of the present invention.

Figure 1:
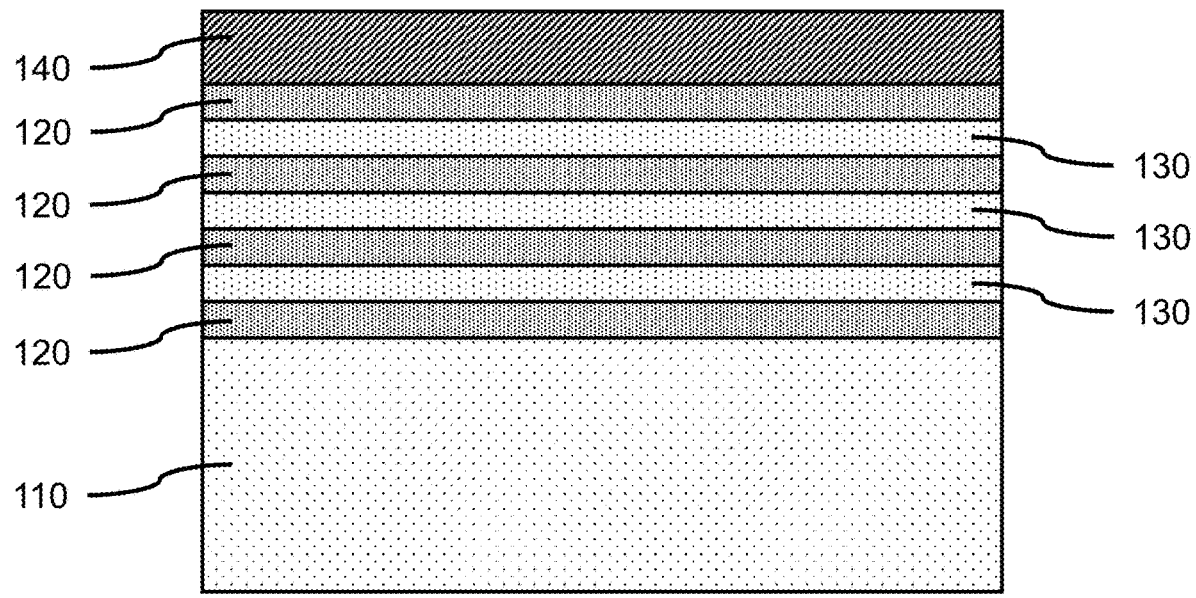
FIG. 1 is a cross-sectional side view showing a plurality of alternating sacrificial layers and nanosheet layers on a substrate, with a device template layer on the top sacrificial layer, in accordance with an embodiment of the present invention.

Referring now to the drawings in which like numerals represent the same or similar elements and initially to FIG. 1, a cross-sectional side view of a plurality of alternating sacrificial layers and nanosheet layers on a substrate, with a device template layer on the top sacrificial layer is shown, in accordance with an embodiment of the present invention.

In one or more embodiments, an alternating sequence of sacrificial layers 120 and nanosheet layers 130 can be formed on a substrate 110, where the sacrificial layers 120 and nanosheet layers 130 can be formed by epitaxial or heteroepitaxial growth on the surface of an underlying layer. In various embodiments, a first sacrificial layer 120 can be formed on the exposed surface of the substrate 110 by epitaxial or heteroepitaxial growth. A first nanosheet layer 130 can be formed on the exposed surface of the substrate 110 by epitaxial or heteroepitaxial growth. A second sacrificial layer 120 can be formed on the exposed surface of the first nanosheet layer 130, where the repeated formation of layers can create an alternating arrangement of sacrificial layers 120 and nanosheet layers 130. In various embodiments, the top layer can be a sacrificial layer 120, so there are is one more sacrificial layer 120 than nanosheet layers 130 to provide access around each of the nanosheet layers 130.

In one or more embodiments, the sacrificial layers 120 are a semiconductor material that can be selectively removed from between nanosheet layers 130, while providing a surface that is conducive to epitaxial or heteroepitaxial growth. In various embodiments, the sacrificial layers 120 can be silicon germanium (SiGe), silicon-germanium carbide (SiGeC), III-V compound semiconductors (e.g., gallium arsenide (GaAs)), II-VI compound semiconductors (e.g., zinc telluride (ZnTe)), and combinations thereof, where the sacrificial layers 120 can be selectively removed from the nanosheet layers 130 forming device channels. The nanosheet layers 130 can be a doped or undoped semiconductor material that can form a device channel for a nanosheet transistor device. In various embodiments, the nanosheet layers 130 can be silicon (Si), silicon carbide (SiC), III-V compound semiconductors (e.g., gallium arsenide (GaAs)), II-VI compound semiconductors (e.g., zinc telluride (ZnTe)), and combinations thereof, such that the sacrificial layers 120 can be selectively removed from the nanosheet layers 130 forming device channels. The nanosheet layers 130 can be the same semiconductor material as the substrate 110, or the nanosheet layers 130 can be a different semiconductor material from the substrate.

In one or more embodiments, the sacrificial layers 120 can have a thickness in a range of about 4 nanometers (nm) to about 15 nm, or about 6 nm to about 12 nm, although other thicknesses are contemplated.

In one or more embodiments, the nanosheet layers 130 can have a thickness in a range of about 3 nm to about 15 nm, or about 5 nm to about 8 nm, although other thicknesses are contemplated.

In various embodiments, the substrate 110 can be a semiconductor substrate, where the semiconductor can be a type IV semiconductor (e.g., silicon (Si), germanium (Ge)), a IV-IV semiconductor (e.g., silicon-germanium (SiGe), silicon carbide (SiC), a III-V semiconductor (e.g., gallium arsenide (GaAs), indium phosphide (InP), indium-gallium arsenide (InGaAs), etc.), where the crystal structure can allow epitaxial growth on a crystalline surface. In various embodiments, the substrate 110 can be a semiconductor-on-insulator substrate (SeOI).

In one or more embodiments, a device template layer 140 can be formed on the top sacrificial layer 120, where the device template layer 140 can be a hardmask formed by a blanket deposition, for example, chemical vapor deposition (CVD) or plasma enhanced CVD (PECVD).

In various embodiments, the device template layer 140 can be a hardmask material, including, but not limited to, silicon oxide (SiO), silicon nitride (SiN), silicon oxynitride (SiON), silicon borocarbonitride (SiBCN), and combinations thereof.

Figure 2:
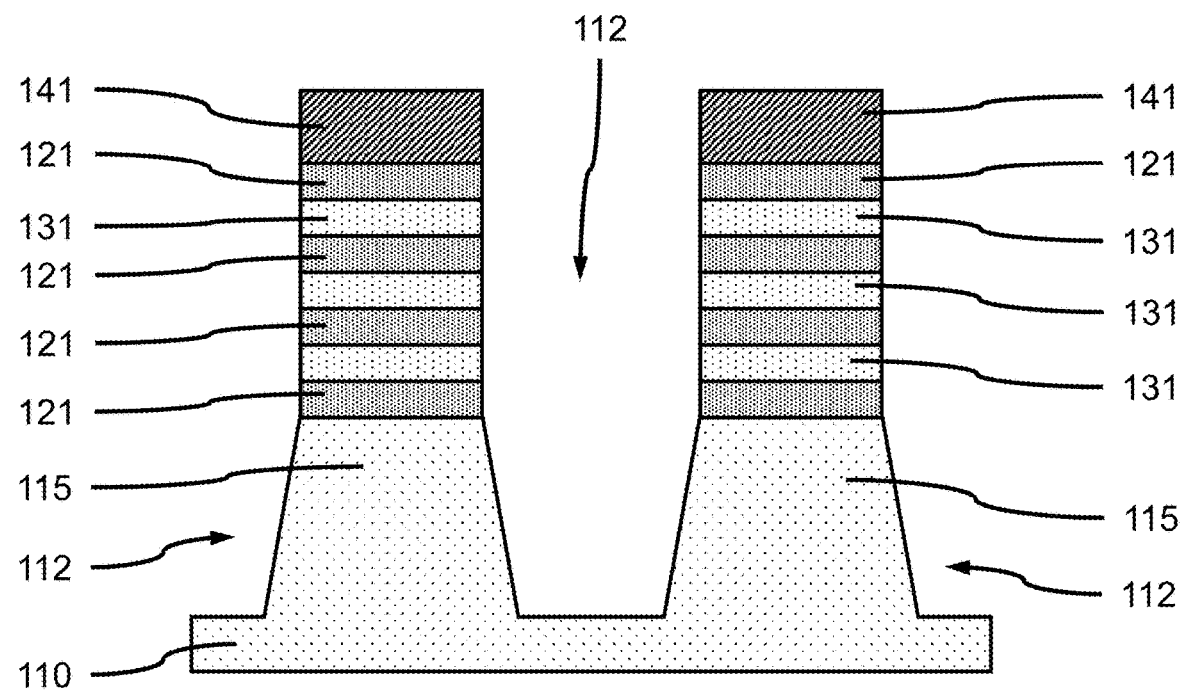
FIG. 2 is a cross-sectional side view showing the plurality of alternating sacrificial layers and nanosheet layers patterned to form a plurality of nanosheet devices on substrate mesas separated by a trench in the substrate, in accordance with an embodiment of the present invention.

FIG. 2 is a cross-sectional side view showing the plurality of alternating sacrificial layers and nanosheet layers patterned to form a plurality of nanosheet devices on substrate mesas separated by a trench in the substrate, in accordance with an embodiment of the present invention.

In one or more embodiments, the device template layer 140 can be patterned using lithographic processes and etching to form one or more device template(s) 141. The device templates can have a predetermined length and width for masking the underlying layers to form sacrificial layer segments 121 and nanosheet layer segments 131. In various embodiments, trenches 112 can be formed through the sacrificial layers 120 and nanosheet layers 130 using a selective, directional etch, for example, a reactive ion etch (RIE) to separate the stacked sacrificial layers 120 and nanosheet layers 130 into stacked sacrificial layer segments 121 and nanosheet layer segments 131. The trenches 112 can be formed into the substrate 110 to a predetermined depth that forms a mesa 115 underneath each stack of sacrificial layer segments 121 and nanosheet layer segments 131, where the trench separates adjacent mesas 115.

Figure 3:
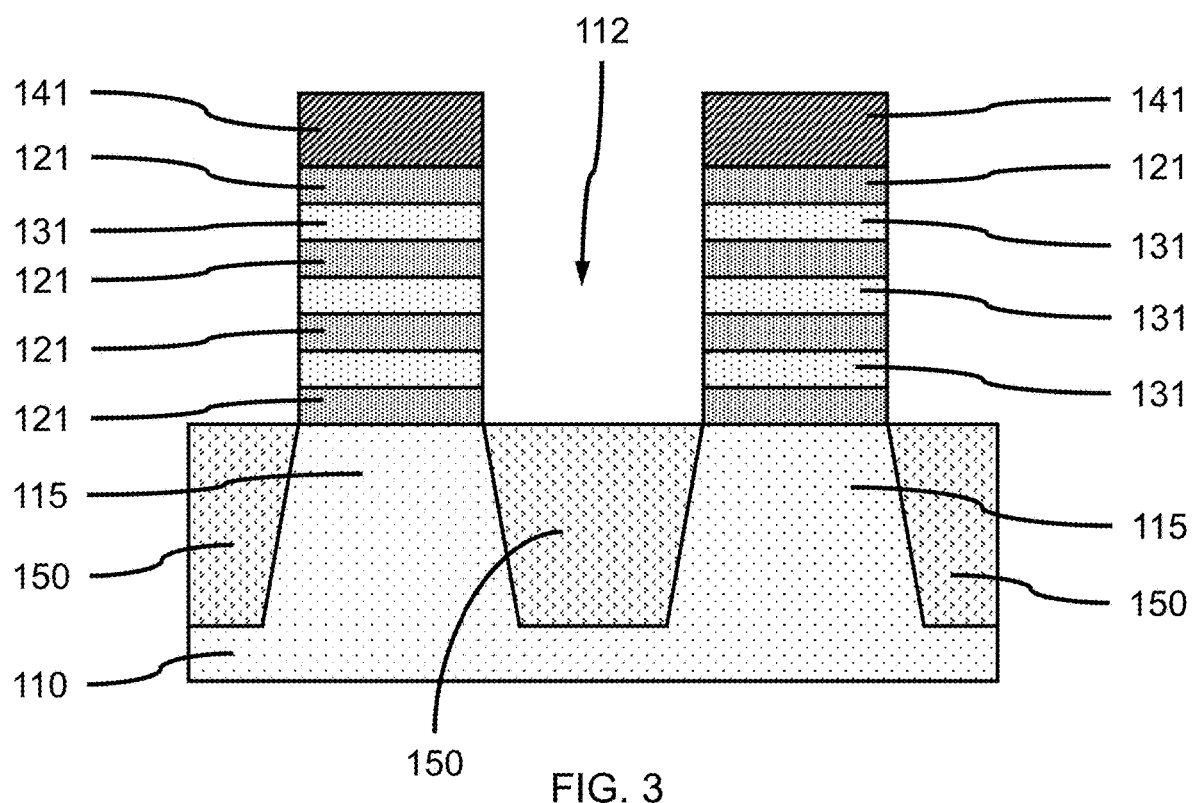
FIG. 3 is a cross-sectional side view showing the trenches filled with a dielectric material to form isolation regions between adjacent mesas, in accordance with an embodiment of the present invention.

FIG. 3 is a cross-sectional side view showing the trenches filled with a dielectric material to form isolation regions between adjacent mesas, in accordance with an embodiment of the present invention.

In one or more embodiments, the trenches 112 can be filled with a dielectric material to form isolation regions 150 between adjacent mesas 115. The trenches 112 can be filled with a dielectric material using a blanket deposition (e.g., CVD, PECVD), where the dielectric material fills the trench(es) 112, and an etch-back can be used to reduce the height of the dielectric material in the trench(es) 112. In various embodiments, a directional deposition, for example, gas cluster ion beam (GCIB) and/or high density plasma (HDP) deposition can be used to form the dielectric material to a predetermined height. The dielectric material can be formed to a height that covers the sidewalls of the mesas 115, but leaves at least a portion of the bottom most sacrificial layer segment(s) 121 exposed.

In various embodiments, the dielectric material can be silicon oxide (SiO), silicon nitride (SiN), a low-k dielectric material, or a combination thereof. A low-k dielectric material can include, but not be limited to, carbon doped silicon oxide (SiO:C), fluorine doped silicon oxide (SiO:F), a polymeric material, for example, tetraethyl orthosilicate (TEOS), hydrogen silsesquioxane (HSQ) and methylsilsesquioxane (MSQ), and combinations thereof.

Figure 4:
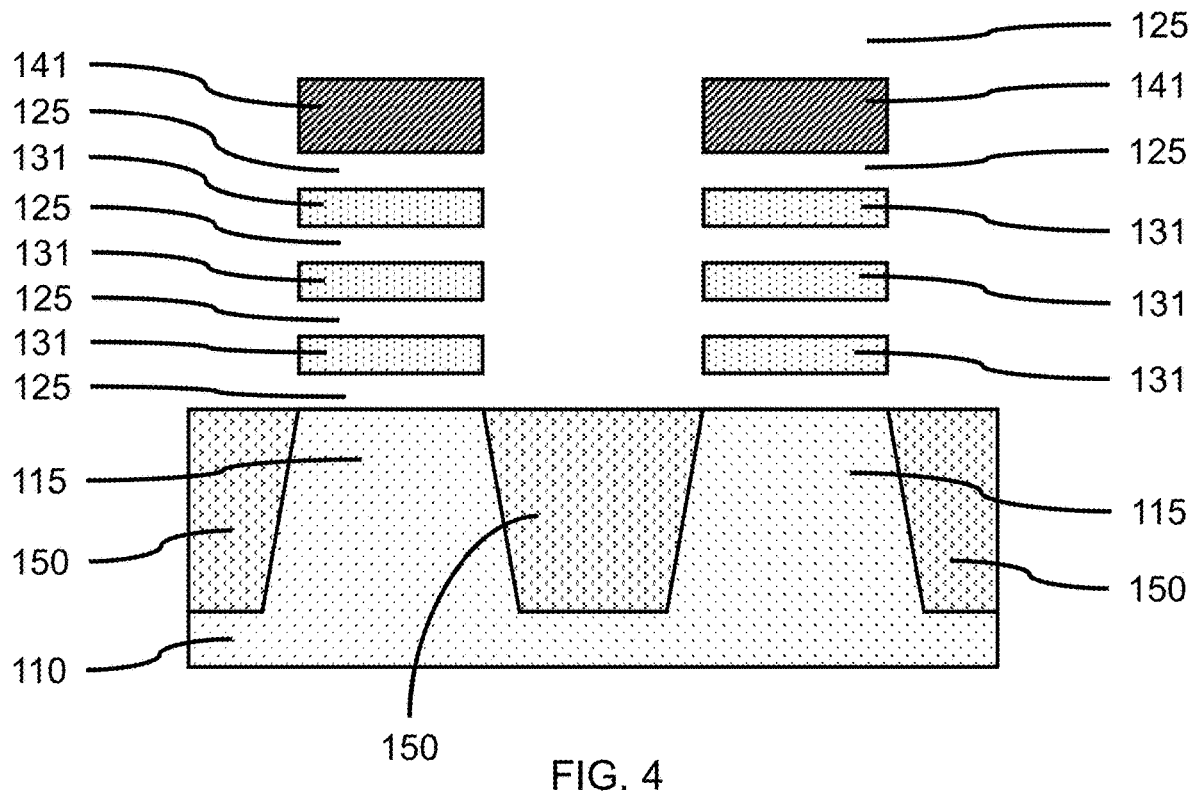
FIG. 4 is a cross-sectional side view showing the plurality of sacrificial layers removed to form channels between adjacent nanosheet segments, in accordance with an embodiment of the present invention.

FIG. 4 is a cross-sectional side view showing the plurality of sacrificial layers removed to form channels between adjacent nanosheet segments, in accordance with an embodiment of the present invention;

In one or more embodiments, the sacrificial layer segments 121 can be removed to form channels 125 between adjacent nanosheet layer segments 131 in a stack. The sacrificial layer segments 121 can be removed using a selective isotropic etch, for example, a wet chemical etch or dry plasma etch, that leaves the nanosheet layer segments 131 and device templates 141. The nanosheet layer segment(s) 131 and device template 141 can be attached to and supported by source/drains (not shown) on opposite ends of the nanosheet layer segments.

In a non-limiting exemplary embodiments, a hydrogen chloride (HCl) wet chemical etch can be used to remove silicon-germanium (SiGe) sacrificial layer segments 121 from between silicon (Si) nanosheet layer segments 131.

Figure 5:
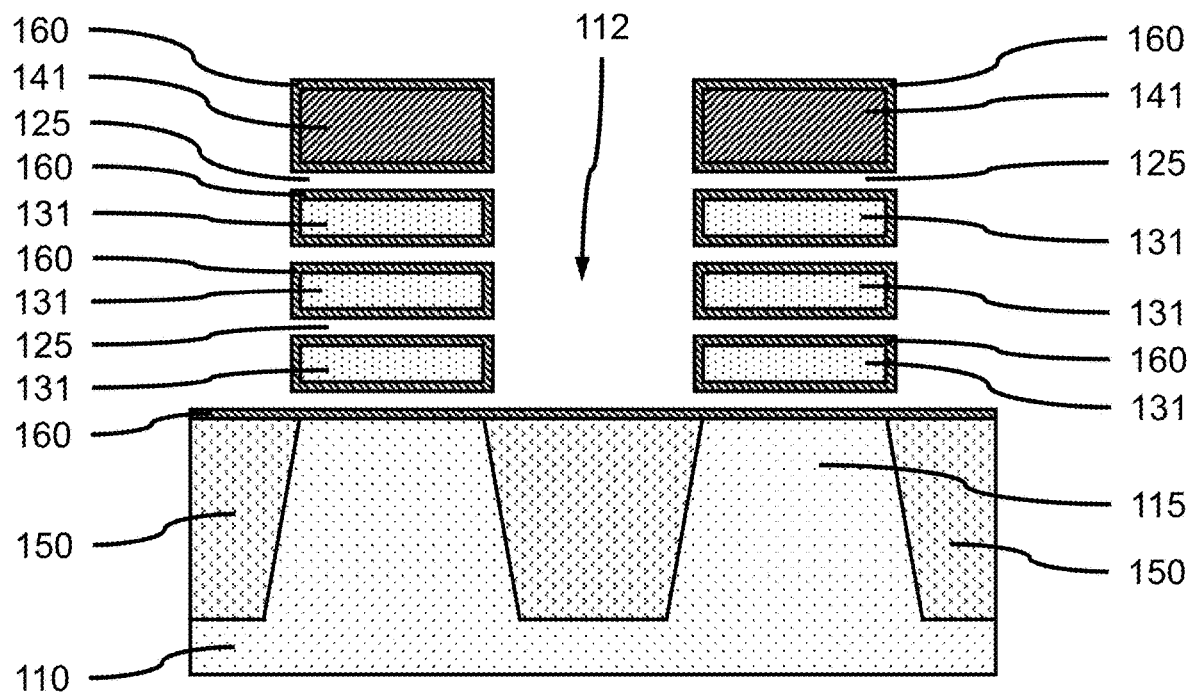
FIG. 5 is a cross-sectional side view showing a gate dielectric layer formed around the nanosheet segments, in accordance with an embodiment of the present invention.

FIG. 5 is a cross-sectional side view showing a gate dielectric layer formed around the nanosheet segments, in accordance with an embodiment of the present invention.

In one or more embodiments, a gate dielectric layer 160 can be formed around the nanosheet layer segments 131 and on the exposed surfaces of the device template 141, substrate 110, and isolation regions 150. The gate dielectric layer 160 can be formed by a conformal deposition, for example, atomic layer deposition (ALD), plasma enhanced ALD (PEALD), or combinations thereof. The gate dielectric layer 160 can be formed on the exposed surfaces of the nanosheet layer segments 131, as part of a gate structure, and on other exposed surfaces, for example, the substrate.

In one or more embodiments, the gate dielectric layer 160 can be a dielectric material, including, but not limited to, silicon oxide (SiO), silicon nitride (SiN), a high-K dielectric material, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof. In various embodiments, aluminum oxide (AlO) is not used as the gate dielectric layer 160.

In one or more embodiments, the gate dielectric layer 160 can have a thickness in a range of about 1 nm to about 5 nm, or about 2 nm to about 3 nm, although other thicknesses are contemplated. The gate dielectric layer 160 on facing surfaces of adjacent nanosheet layer segments 131 and/or device templates 141 can fill in a portion of the channels 125, while leaving sufficient space between the adjacent layers to form a gate electrode.

Figure 6:
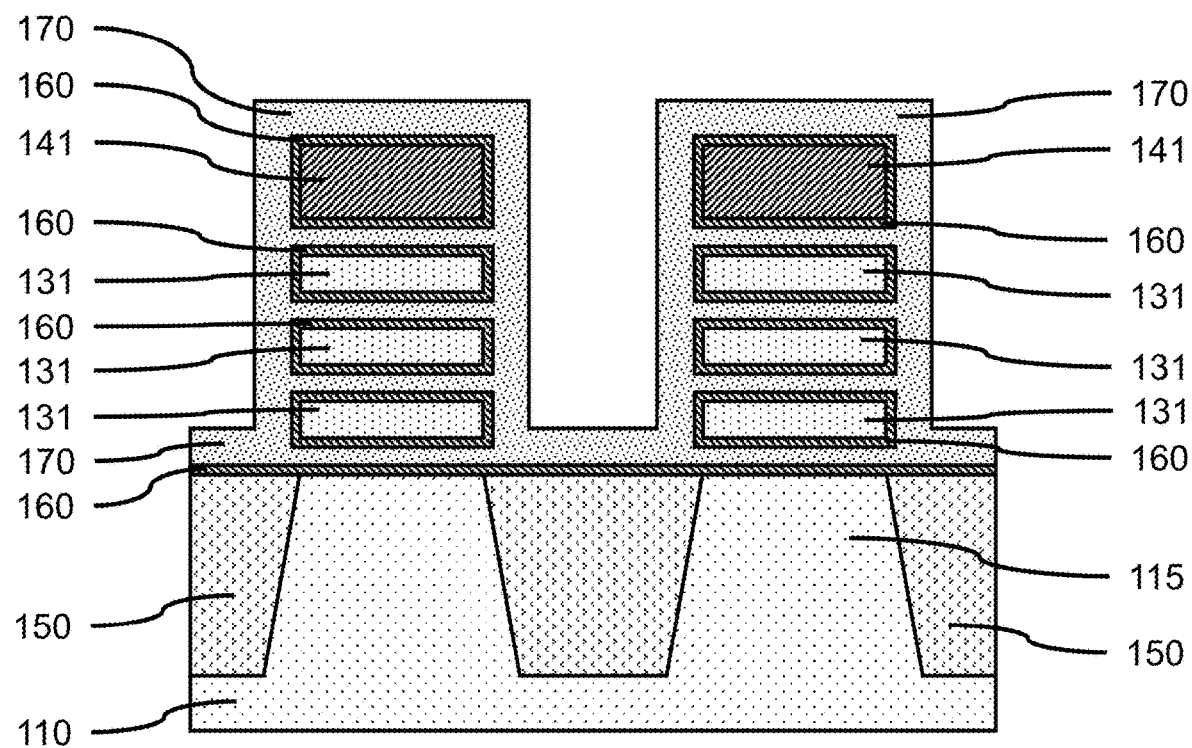
FIG. 6 is a cross-sectional side view showing a work function material layer formed on the gate dielectric layer in the channels around the nanosheet segments, in accordance with an embodiment of the present invention.

FIG. 6 is a cross-sectional side view showing a work function material layer formed on the gate dielectric layer in the channels around the nanosheet segments, in accordance with an embodiment of the present invention.

In one or more embodiments, a work function material layer 170 can be formed on the gate dielectric layer 160 around the nanosheet layer segments 131, where the work function material layer 170 can be formed by a conformal deposition (e.g., ALD, PEALD) to fill in the open portions of the channels 125 and cover the outer surfaces of the gate dielectric layer 160. The work function material layer 170 can cover the gate dielectric layer 160 on the substrate 110.

In various embodiments, the work function material layer 170 can be an oxygen-rich transition metal nitride, for example, titanium oxynitride (TiON), tantalum oxynitride (TaON), zirconium oxynitride (ZrON), hafnium oxynitride (HfON), a conducting transition metal nitride or carbide compound material, for example, tantalum nitride (TaN), titanium nitride (TiN), tantalum carbide (TaC), titanium carbide (TiC), titanium aluminum carbide (TiAlC), and combinations thereof. In various embodiments, the oxygen-rich transition metal nitrides can be formed by introducing an oxygen-supplying species during deposition and/or introducing one or more air breaks during the deposition process. In various embodiments, an oxygen-rich transition metal nitride can be formed by depositing alternating layers of a transition metal nitride and the transition metal oxide, MN/MO/MN/MO/MN, etc., where the order and/or thickness of the layers can determine the ratio of oxide to nitride and the oxygen concentration in the work function material layer 170.

In various embodiments, an oxygen-rich transition metal nitride can have an oxygen concentration in a range of about 5 atomic percent (at. %) to 25 at. %, or about 10 at. % to about 20 at. %, although other concentrations are contemplated. The oxygen concentration can alter the threshold voltage of the nanosheet device to provide a super low threshold voltage.

Figure 7:
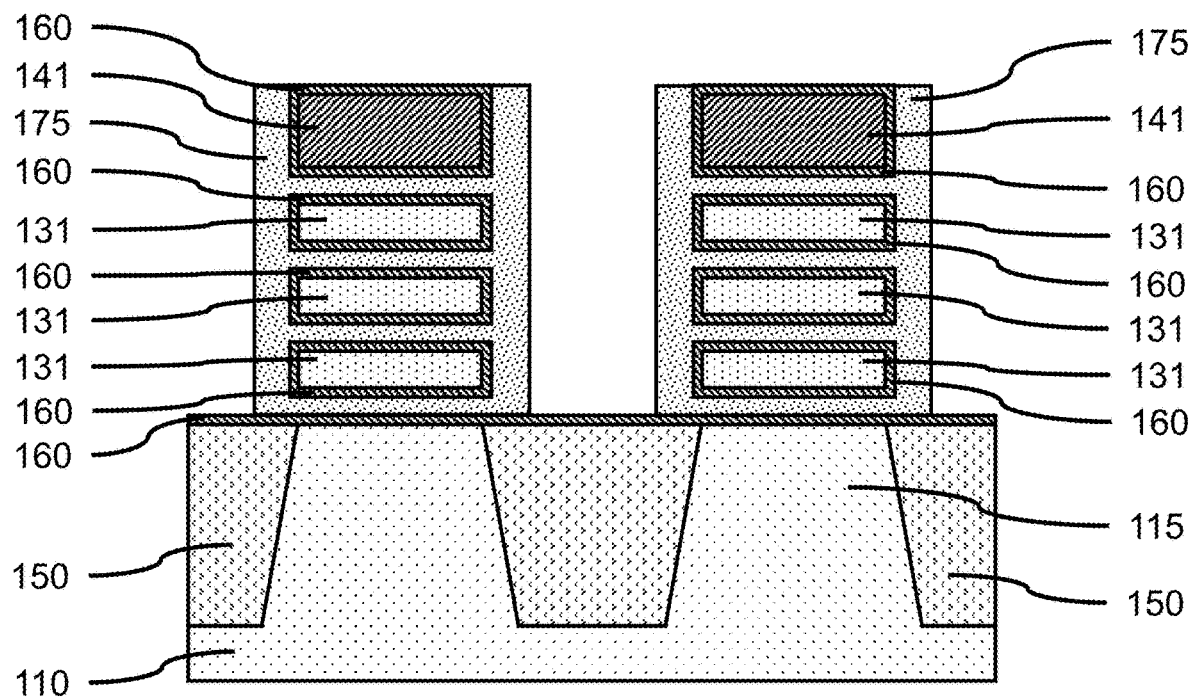
FIG. 7 is a cross-sectional side view showing portions of the work function material layer removed from between adjacent nanosheet devices to form work function material blocks on the nanosheet segments, in accordance with an embodiment of the present invention.

FIG. 7 is a cross-sectional side view showing portions of the work function material layer removed from between adjacent nanosheet devices to form work function material blocks on the nanosheet segments, in accordance with an embodiment of the present invention.

In one or more embodiments, portions of the work function material layer 170 removed from the top surfaces and between adjacent stacks of nanosheet layer segments 131 forming nanosheet devices to form separate work function material blocks 175 on each of the stacks. The portions of the work function material layer 170 can be removed using a selective, directional etch (e.g., RIE), where the work function material layer 170 can remain on the sidewalls of the stacks and within the channels 125 to form a gate electrode on the gate dielectric layer 160. The gate dielectric layer 160 and work function material block 175 can form a gate structure on a nanosheet device, where the gate structure can be a gate-all-around structure.

Figure 8:
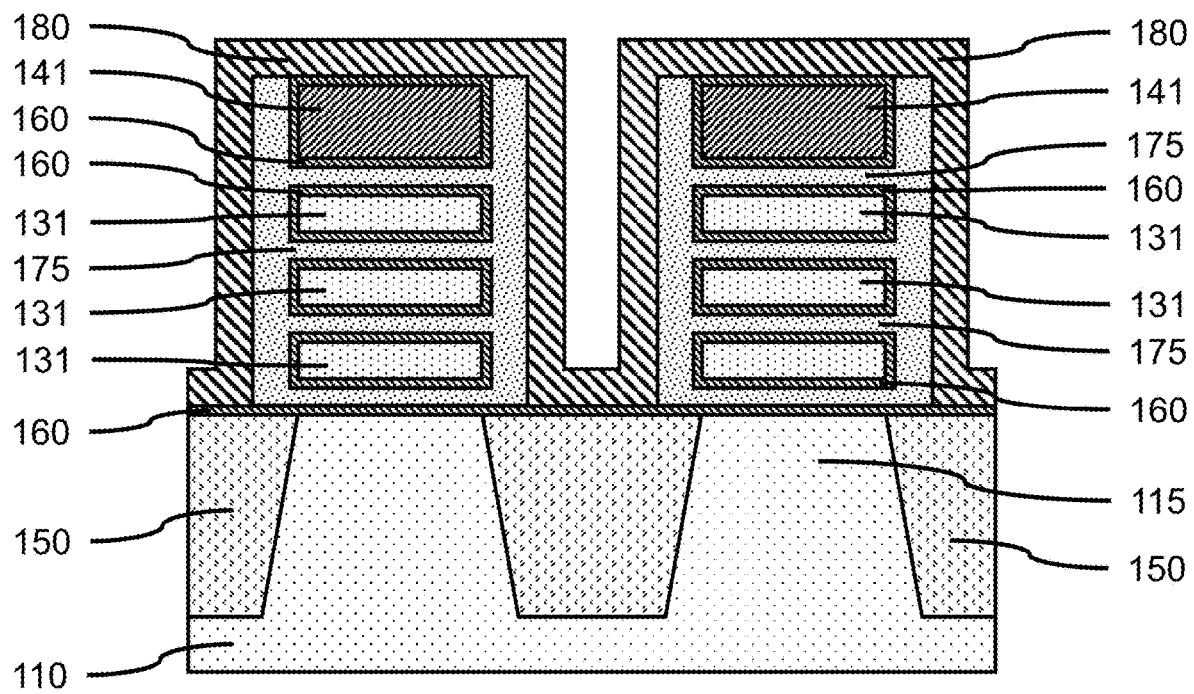
FIG. 8 is a cross-sectional side view showing a capping layer formed on the work function material blocks and substrate between adjacent nanosheet devices, in accordance with an embodiment of the present invention.

FIG. 8 is a cross-sectional side view showing a capping layer formed on the work function material blocks and substrate between adjacent nanosheet devices, in accordance with an embodiment of the present invention.

In one or more embodiments, a capping layer 180 can be formed on the work function material blocks 175 and substrate 110 between adjacent nanosheet devices. The capping layer 180 can be formed by a conformal deposition (e.g., ALD, PEALD).

In various embodiments, the capping layer 180 can be a barrier material that can block out-diffusion of oxygen from the oxygen-rich transition metal nitrides of the work function material block 175. In various embodiments, the capping layer 180 can be a metal with oxygen barrier properties, including, but not limited to, tungsten (W), cobalt (Co), copper (Cu), platinum (Pt), and combinations thereof. Without intending to be bound by theory, it is believed that preventing loss of oxygen from the oxygen-rich transition metal nitride of the work function material block 175 can maintain a high work function and super low threshold voltage (Vt).

Figure 9:
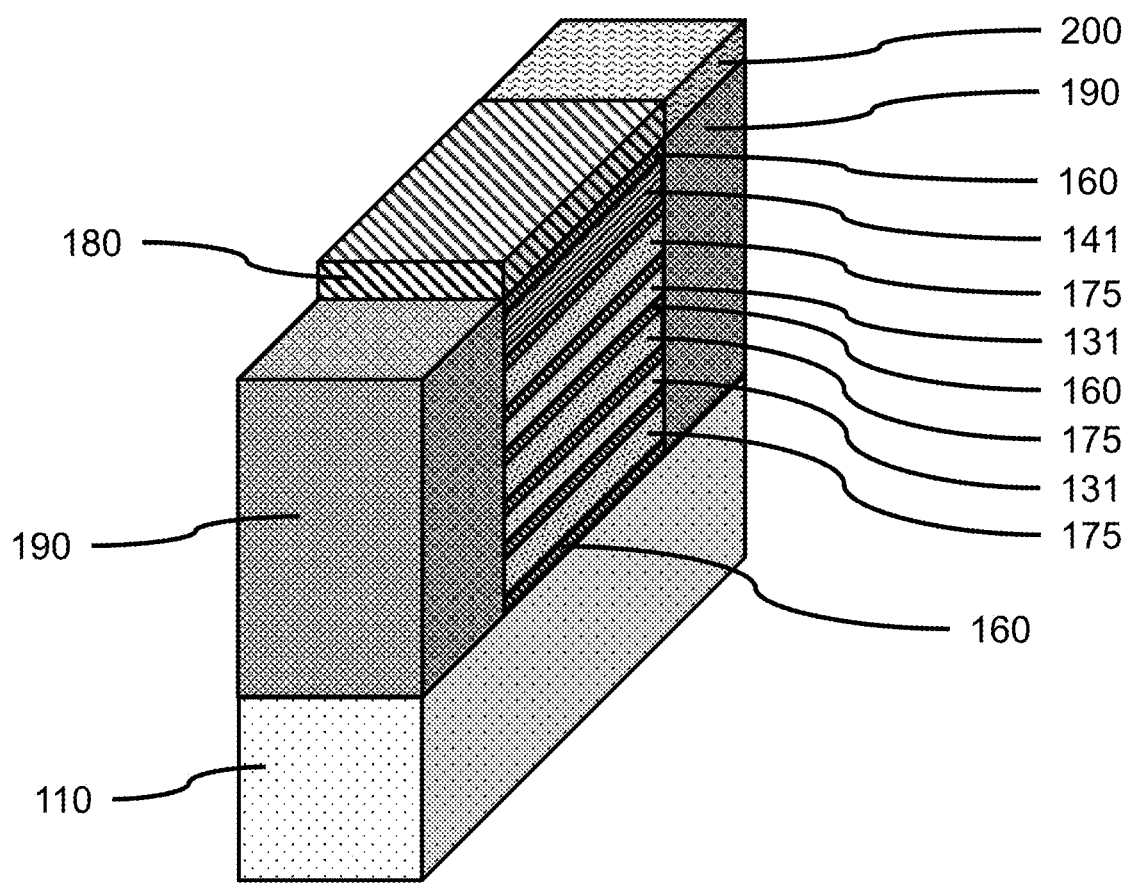
FIG. 9 is an orthographic cut-away view showing an arrangement of the capping layer on the work function material blocks and nanosheet segments, in accordance with an embodiment of the present invention.

FIG. 9 is an orthographic cut-away view showing an arrangement of the capping layer on the work function material blocks and nanosheet segments, in accordance with an embodiment of the present invention.

In one or more embodiments, a source/drain 190 can be formed on a substrate 110 by epitaxial or heteroepitaxial growth. In various embodiments, the source/drain 190 can be a semiconductor material doped with an n-type dopant (e.g., phosphorus (P), arsenic (As), etc.) or a p-type dopant (e.g., boron (B), gallium (Ga), etc.). In a non-limiting exemplary embodiment, the source/drain 190 can be phosphorus-doped silicon (Si:P) to form an n-type FET or a boron-doped silicon germanium (SiGe:B) to form a p-type FET.

In various embodiments, source/drains 190 can be on opposite ends of a stack of nanosheet layer segment(s) 131, where the source/drains 190 are electrically connected to the nanosheet layer segment(s) 131 and support the nanosheet layer segment(s). The nanosheet layer segments 131 can form device channels between the source/drains 190. The gate dielectric layer 160 can be around each of the nanosheet layer segments 131 and on the exposed surfaces of the source/drains 190, device template 141, and substrate 110. The oxygen-rich transition metal nitride of the work function material block 175 can fill in the channels 125 between the gate dielectric layer 160 to form a gate-all-around structure on the nanosheet layer segments 131. The capping layer 180 can cover the work function material block 175. A dielectric layer 200 can physically and electrically separate a conductive capping layer 180 from the source/drains 190 to prevent electrical shorting.

In various embodiments, a nanosheet device with an oxygen-rich transition metal nitride work function material block 175 can have a threshold voltage (Vt) in a range of about 0 volts (V) to about 200 millivolts (mV), or in a range of about 50 mV to about 150 mV, or about 75 mV to about 100 mV, although other threshold voltages are contemplated. The use of an oxygen rich transition metal nitride can reduce the threshold voltage (Vt) can be up to 50 mV less than a gate structure with a transition metal nitride work function layer.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the s g lar forms "a" "a and the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A nanosheet field effect transistor device, comprising:
   a first source/drain and a second source/drain on a substrate;
   at least one nanosheet layer segment disposed between the first source/drain and the second source/drain;
   a gate dielectric layer wrapped around each of the at least one nanosheet layer segment;
   an oxygen rich transition metal nitride work function block wrapped around each of the gate dielectric layer and the at least one nanosheet layer segment; and
   a capping layer wrapped around an outer surface of the work function material block.

2. The nanosheet field effect transistor device of claim 1, wherein the gate dielectric layer is on the substrate and between the substrate and the oxygen rich transition metal nitride work function block.

3. The nanosheet field effect transistor device of claim 2, wherein the oxygen rich transition metal nitride is selected from the group consisting of titanium oxynitride (TiON), tantalum oxynitride (TaON), zirconium oxynitride (ZrON), hafnium oxynitride (HfON), and combinations thereof.

4. The nanosheet field effect transistor device of claim 3, wherein the gate dielectric layer is a high-k dielectric material.

5. The nanosheet field effect transistor device of claim 4, wherein the gate dielectric layer is not aluminum oxide (AlO).

6. The nanosheet field effect transistor device of claim 4, further comprising a device template above the at least one nanosheet layer segment, wherein the gate dielectric layer and the oxygen rich transition metal nitride work function block is around at least three sides of the device template.

7. The nanosheet field effect transistor device of claim 6, wherein the capping layer is a metal selected from the group consisting of tungsten (W), cobalt (Co), copper (Cu), platinum (Pt), and combinations thereof.

8. A nanosheet field effect transistor device, comprising:
   a first source/drain and a second source/drain on a substrate;
   at least one nanosheet layer segment disposed between the first source/drain and the second source/drain;
   a device template disposed between the first source/drain and the second source/drain, wherein the at least one nanosheet layer segment is between the device template and the substrate;
   a gate dielectric layer on each of the at least one nanosheet layer segment and on the device template;
   an oxygen rich transition metal nitride work function block on the gate dielectric layer, the at least one nanosheet layer segment, and between the device template and a top one of the at least one nanosheet layer segment; and
   a capping layer on the work function material block.

9. The nanosheet field effect transistor device of claim 8, wherein the gate dielectric layer is between the capping layer and the device template.

10. The nanosheet field effect transistor device of claim 9, wherein the oxygen rich transition metal nitride is selected from the group consisting of titanium oxynitride (TiON), tantalum oxynitride (TaON), zirconium oxynitride (ZrON), hafnium oxynitride (HfON), and combinations thereof.

11. The nanosheet field effect transistor device of claim 10, wherein the oxygen rich transition metal nitride has an oxygen concentration in a range of about 5 atomic percent (at. %) to about 25 at. %.

12. The nanosheet field effect transistor device of claim 11, further comprising an isolation region below a portion of the oxygen rich transition metal nitride work function block, wherein the gate dielectric layer separates the isolation region from the oxygen rich transition metal nitride work function block.

13. The nanosheet field effect transistor device of claim 11, wherein the gate dielectric layer is a high-k dielectric al selected from the group consisting of hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), and tantalum oxide (TaO).

14. The nanosheet field effect transistor device of claim 13, wherein the capping layer is a metal selected from the group consisting of tungsten (W), cobalt (Co), copper (Cu), platinum (Pt), and combinations thereof.

15. A nanosheet field effect transistor device, comprising:
a first source/drain and a second source/drain on a substrate;
at least one nanosheet layer segment disposed between the first source/drain and a second source/drain;
a gate dielectric layer wrapped around each of the at least one nanosheet layer segment and on a mesa underneath the at least one nanosheet layer segment;
an oxygen rich transition metal nitride work function block wrapped around each of the gate dielectric layer and the at least one nanosheet layer segment, wherein the gate dielectric layer is on the substrate and between the substrate and the oxygen rich transition metal nitride work function block; and
a capping layer wrapped around an outer surface of the work function material block, wherein the capping layer is an oxygen diffusion barrier.

16. The nanosheet field effect transistor device of claim 15, wherein the oxygen rich transition metal nitride is selected from the group consisting of titanium oxynitride (TiON), tantalum oxynitride (TaON), zirconium oxynitride (ZrON), hafnium oxynitride (HfON), and combinations thereof.

17. The nanosheet field effect transistor device of claim 16, wherein the oxygen rich transition metal nitride has an oxygen concentration in a range of about 5 atomic percent (at. %) to about 25 at. %.

18. The nanosheet field effect transistor device of claim 16, wherein the capping layer is a metal selected from the group consisting of tungsten (W), cobalt (Co), copper (Cu), platinum (Pt), and combinations thereof.

19. The nanosheet field effect transistor device of claim 18 wherein the first source/drain and the second source/drain are both doped with a p-type dopant.

20. The nanosheet field effect transistor device of claim 18, wherein the nanosheet field effect transistor device has a threshold voltage between about 0 volts and 200 mV.

* * * * *